United States Patent
Choi et al.

(10) Patent No.: US 9,534,288 B2
(45) Date of Patent: Jan. 3, 2017

(54) DEPOSITION APPARATUS, METHOD OF MANUFACTURING ORGANIC LIGHT-EMITTING DISPLAY APPARATUS BY USING SAME, AND ORGANIC LIGHT-EMITTING DISPLAY APPARATUS MANUFACTURED BY USING DEPOSITION APPARATUS

(71) Applicant: Samsung Display Co., Ltd., Yongin, Gyeonggi-Do (KR)

(72) Inventors: Young-Mook Choi, Yongin (KR); Jong-Won Hong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 205 days.

(21) Appl. No.: 14/012,924

(22) Filed: Aug. 28, 2013

(65) Prior Publication Data

US 2014/0312316 A1    Oct. 23, 2014

(30) Foreign Application Priority Data

Apr. 18, 2013 (KR) ........................ 10-2013-0043030

(51) Int. Cl.
*C23C 14/56* (2006.01)
*H01L 21/677* (2006.01)
(Continued)

(52) U.S. Cl.
CPC ............. *C23C 14/56* (2013.01); *C23C 14/042* (2013.01); *C23C 14/50* (2013.01);
(Continued)

(58) Field of Classification Search
CPC .............................................. H01L 21/67709
See application file for complete search history.

(56) References Cited

U.S. PATENT DOCUMENTS 4,416,217 A    11/1983  Nakamura et al.
4,468,648 A    8/1984   Uchikune
(Continued)

FOREIGN PATENT DOCUMENTS

CN    1556872 A    12/2004
CN    1607868 A    4/2005
(Continued)

OTHER PUBLICATIONS

Patent Abstracts of Japan and English Machine Translation of JP 2003-297562 A, 21 pages.
(Continued)

*Primary Examiner* — Lex Malsawma
*Assistant Examiner* — Gardner W Swan
(74) *Attorney, Agent, or Firm* — Lewis Roca Rothgerber Christie LLP

(57) ABSTRACT

A deposition apparatus includes: a transfer unit including a first transfer unit and a second transfer unit, wherein the first transfer unit transfers, in a first direction, a moving unit to which a substrate is detachably fixed, and the second transfer unit transfers, in an opposite direction of the first direction, the moving unit from which the substrate is separated, and a deposition unit including a deposition assembly wherein the deposition assembly deposits a material on the substrate spaced apart from the deposition assembly while the first transfer unit transfers the substrate which is fixed to the moving unit, wherein the first transfer unit includes a first support unit that supports both ends of the moving unit in the first direction, and a second support unit that supports a side of the moving unit opposite to a side close to the deposition assembly.

8 Claims, 8 Drawing Sheets

(51) Int. Cl.
*C23C 14/04* (2006.01)
*C23C 14/50* (2006.01)
*H01L 51/56* (2006.01)
*H01L 51/00* (2006.01)
*H01L 21/673* (2006.01)
*H01L 21/67* (2006.01)

(52) U.S. Cl.
CPC .. *H01L 21/67709* (2013.01); *H01L 21/67259* (2013.01); *H01L 21/67309* (2013.01); *H01L 51/0001* (2013.01); *H01L 51/56* (2013.01)

(56) References Cited

U.S. PATENT DOCUMENTS

| | | | |
|---|---|---|---|
| 4,805,761 A * | 2/1989 | Totsch | B65G 54/02 104/156 |
| 5,360,470 A * | 11/1994 | Ono | B60L 13/06 104/284 |
| 5,377,596 A * | 1/1995 | Ono | B60L 13/06 104/284 |
| 5,487,609 A | 1/1996 | Asada | |
| 5,641,054 A * | 6/1997 | Mori et al. | 198/619 |
| 6,222,198 B1 | 4/2001 | Brown | |
| 6,271,606 B1 * | 8/2001 | Hazelton | G03F 7/70758 250/491.1 |
| 6,274,198 B1 | 8/2001 | Dautartas | |
| 6,371,451 B1 | 4/2002 | Choi | |
| 6,417,034 B2 | 7/2002 | Kitazume et al. | |
| 6,589,673 B1 | 7/2003 | Kido et al. | |
| 6,684,794 B2 * | 2/2004 | Fiske | B60L 13/04 104/281 |
| 6,699,324 B1 | 3/2004 | Berdin et al. | |
| 6,749,906 B2 | 6/2004 | Van Slyke | |
| RE39,024 E | 3/2006 | Takahashi | |
| 7,078,070 B2 | 7/2006 | Peng | |
| 8,192,546 B2 | 6/2012 | Kim et al. | |
| 8,673,077 B2 | 3/2014 | Sonoda et al. | |
| 8,900,976 B2 * | 12/2014 | Jin et al. | 438/478 |
| 9,246,377 B2 * | 1/2016 | Fukasawa | H01L 21/67709 |
| 2001/0006827 A1 | 7/2001 | Yamazaki et al. | |
| 2001/0034175 A1 | 10/2001 | Miyazaki et al. | |
| 2002/0011785 A1 | 1/2002 | Tang et al. | |
| 2002/0017245 A1 | 2/2002 | Tsubaki et al. | |
| 2002/0168577 A1 | 11/2002 | Yoon | |
| 2002/0179013 A1 | 12/2002 | Kido et al. | |
| 2002/0194727 A1 | 12/2002 | Cho et al. | |
| 2003/0101937 A1 | 6/2003 | Van Slyke et al. | |
| 2003/0168013 A1 | 9/2003 | Freeman et al. | |
| 2003/0221614 A1 | 12/2003 | Kang et al. | |
| 2003/0221620 A1 | 12/2003 | Yamazaki | |
| 2003/0232563 A1 * | 12/2003 | Kamiyama et al. | 445/24 |
| 2004/0028349 A1 | 2/2004 | Nagasaka et al. | |
| 2004/0056244 A1 | 3/2004 | Marcus et al. | |
| 2004/0062856 A1 | 4/2004 | Marcus et al. | |
| 2004/0115338 A1 | 6/2004 | Yoneda | |
| 2004/0119358 A1 * | 6/2004 | Thornton | B60L 13/06 310/180 |
| 2004/0123804 A1 | 7/2004 | Yamazaki et al. | |
| 2004/0127066 A1 | 7/2004 | Jung | |
| 2004/0134428 A1 | 7/2004 | Sasaki et al. | |
| 2004/0142108 A1 | 7/2004 | Atobe et al. | |
| 2004/0144321 A1 | 7/2004 | Grace et al. | |
| 2004/0157167 A1 | 8/2004 | Mori | |
| 2004/0194702 A1 | 10/2004 | Sasaki et al. | |
| 2004/0237895 A1 | 12/2004 | Carpenter et al. | |
| 2004/0255857 A1 | 12/2004 | Chow et al. | |
| 2005/0016461 A1 | 1/2005 | Klung et al. | |
| 2005/0031836 A1 | 2/2005 | Hirai | |
| 2005/0037136 A1 | 2/2005 | Yamamoto | |
| 2005/0072359 A1 | 4/2005 | Kim | |
| 2005/0166842 A1 | 8/2005 | Sakamoto | |
| 2005/0166844 A1 | 8/2005 | Gralenski | |
| 2005/0183670 A1 | 8/2005 | Grantham et al. | |
| 2005/0244580 A1 | 11/2005 | Cok et al. | |
| 2005/0263074 A1 | 12/2005 | Masuda et al. | |
| 2005/0280356 A1 | 12/2005 | Murayama et al. | |
| 2006/0012280 A1 | 1/2006 | Kang et al. | |
| 2006/0040132 A1 | 2/2006 | Liao et al. | |
| 2006/0102078 A1 | 5/2006 | Fairbairn et al. | |
| 2006/0103289 A1 | 5/2006 | Kim et al. | |
| 2006/0130766 A1 | 6/2006 | Kim et al. | |
| 2006/0144325 A1 | 7/2006 | Jung et al. | |
| 2006/0150910 A1 | 7/2006 | Han et al. | |
| 2006/0169211 A1 | 8/2006 | Kim et al. | |
| 2006/0174829 A1 | 8/2006 | An et al. | |
| 2006/0205101 A1 | 9/2006 | Lee et al. | |
| 2006/0269671 A1 | 11/2006 | Kim et al. | |
| 2007/0009552 A1 | 1/2007 | Whitehead et al. | |
| 2007/0009652 A1 | 1/2007 | Manz et al. | |
| 2007/0015430 A1 | 1/2007 | Nishio et al. | |
| 2007/0017445 A1 | 1/2007 | Takehara et al. | |
| 2007/0046913 A1 | 3/2007 | Shibazaki | |
| 2007/0054051 A1 * | 3/2007 | Arai et al. | 427/248.1 |
| 2007/0077358 A1 | 4/2007 | Jeong et al. | |
| 2007/0137568 A1 | 6/2007 | Schreiber | |
| 2007/0178708 A1 | 8/2007 | Ukigaya | |
| 2007/0235157 A1 | 10/2007 | Bunker et al. | |
| 2007/0275497 A1 | 11/2007 | Kwack et al. | |
| 2008/0018236 A1 | 1/2008 | Arai et al. | |
| 2008/0029368 A1 * | 2/2008 | Komori | 198/619 |
| 2008/0115729 A1 | 5/2008 | Oda et al. | |
| 2008/0118743 A1 | 5/2008 | Lee et al. | |
| 2008/0131587 A1 | 6/2008 | Boroson et al. | |
| 2008/0216741 A1 | 9/2008 | Ling et al. | |
| 2008/0290791 A1 | 11/2008 | Lee et al. | |
| 2008/0305246 A1 * | 12/2008 | Choi et al. | 427/74 |
| 2009/0002659 A1 * | 1/2009 | Hiyama | 355/53 |
| 2009/0017192 A1 | 1/2009 | Matsuura | |
| 2009/0229524 A1 | 9/2009 | Kim et al. | |
| 2009/0232976 A1 | 9/2009 | Yoon et al. | |
| 2009/0279173 A1 | 11/2009 | Chui et al. | |
| 2010/0130020 A1 | 5/2010 | Kim et al. | |
| 2010/0239746 A1 | 9/2010 | Yamazaki et al. | |
| 2010/0316791 A1 | 12/2010 | Lin | |
| 2010/0316801 A1 | 12/2010 | Lee et al. | |
| 2011/0052791 A1 * | 3/2011 | Jo | C23C 14/042 427/8 |
| 2011/0052795 A1 | 3/2011 | Choi et al. | |
| 2011/0053301 A1 * | 3/2011 | Kang et al. | 438/34 |
| 2011/0244120 A1 | 10/2011 | Choi et al. | |
| 2012/0006259 A1 | 1/2012 | Sung et al. | |
| 2012/0295379 A1 * | 11/2012 | Sonoda et al. | 438/34 |
| 2012/0326157 A1 | 12/2012 | Park et al. | |
| 2013/0009177 A1 | 1/2013 | Chang et al. | |
| 2013/0217158 A1 | 8/2013 | Lee | |
| 2013/0267055 A1 | 10/2013 | Ro et al. | |
| 2013/0341598 A1 * | 12/2013 | Chang et al. | 257/40 |
| 2014/0034917 A1 | 2/2014 | Lee et al. | |
| 2014/0045343 A1 | 2/2014 | Choi et al. | |
| 2014/0077168 A1 | 3/2014 | Kim | |
| 2014/0084262 A1 | 3/2014 | Kim | |
| 2014/0084263 A1 | 3/2014 | Jin et al. | |
| 2014/0110680 A1 | 4/2014 | Choe | |
| 2014/0131667 A1 | 5/2014 | Chang | |
| 2015/0122180 A1 * | 5/2015 | Chang et al. | C23C 16/4585 |

FOREIGN PATENT DOCUMENTS

| | | |
|---|---|---|
| CN | 1704501 A | 12/2005 |
| CN | 1716102 A | 1/2006 |
| CN | 1814854 A | 8/2006 |
| CN | 102005541 A | 8/2013 |
| EP | 1 413 644 A2 | 4/2004 |
| EP | 1 418 250 A2 | 5/2004 |
| EP | 1 518 940 A1 | 3/2005 |
| EP | 1 944 122 A1 | 7/2008 |
| JP | 2-247372 | 10/1990 |
| JP | 4-272170 | 9/1992 |
| JP | 09-095776 | 4/1997 |
| JP | 10-050478 | 2/1998 |
| JP | 2000-68054 | 3/2000 |
| JP | 2001-52862 | 2/2001 |
| JP | 2001-93667 | 4/2001 |

(56) References Cited

FOREIGN PATENT DOCUMENTS

| | | |
|---|---|---|
| JP | 2002-175878 A | 6/2002 |
| JP | 2002-348659 | 12/2002 |
| JP | 2003-3250 | 1/2003 |
| JP | 2003-77662 | 3/2003 |
| JP | 2003-157973 A | 5/2003 |
| JP | 2003-297562 A | 10/2003 |
| JP | 2004-43898 | 2/2004 |
| JP | 2004-076150 | 3/2004 |
| JP | 2004-103269 | 4/2004 |
| JP | 2004-103341 | 4/2004 |
| JP | 2004-137583 | 5/2004 |
| JP | 2004-143521 | 5/2004 |
| JP | 2004-199919 | 7/2004 |
| JP | 2004-349101 | 12/2004 |
| JP | 2005-44592 | 2/2005 |
| JP | 2005-213616 | 8/2005 |
| JP | 2005-235568 | 9/2005 |
| JP | 2005-293968 | 10/2005 |
| JP | 2005-296737 | 10/2005 |
| JP | 2006-275433 | 10/2006 |
| JP | 2007-47293 | 2/2007 |
| JP | 2007-146219 | 6/2007 |
| JP | 2008-121098 | 5/2008 |
| JP | 2009-19243 | 1/2009 |
| JP | 2009-87910 | 4/2009 |
| JP | 2009-520110 | 5/2009 |
| JP | 2010-140840 | 6/2010 |
| KR | 1997-008709 | 2/1997 |
| KR | 10-0257219 B1 | 2/2000 |
| KR | 10-2000-0019254 | 4/2000 |
| KR | 10-2000-0023929 | 5/2000 |
| KR | 10-2001-0059939 | 7/2001 |
| KR | 10-2002-0000201 | 1/2002 |
| KR | 10-2002-0050922 | 8/2002 |
| KR | 10-2002-0090934 | 12/2002 |
| KR | 10-2003-0043012 | 6/2003 |
| KR | 10-0397635 B1 | 9/2003 |
| KR | 10-0405080 | 11/2003 |
| KR | 10-0406059 | 11/2003 |
| KR | 10-2003-0091947 | 12/2003 |
| KR | 10-2003-0093959 | 12/2003 |
| KR | 10-2004-0034537 | 4/2004 |
| KR | 10-2004-0050045 | 6/2004 |
| KR | 10-2004-0069281 | 8/2004 |
| KR | 10-2004-0084747 | 10/2004 |
| KR | 10-0463212 B1 | 12/2004 |
| KR | 10-0483487 B1 | 4/2005 |
| KR | 10-0520159 B1 | 10/2005 |
| KR | 10-2006-0001033 | 1/2006 |
| KR | 10-2006-0008602 | 1/2006 |
| KR | 10-2006-0018745 | 3/2006 |
| KR | 10-2006-0060994 | 6/2006 |
| KR | 10-2006-0073367 | 6/2006 |
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0104675 | 10/2006 |
| KR | 10-2006-0104677 | 10/2006 |
| KR | 10-2006-0109627 | 10/2006 |
| KR | 10-0635903 B1 | 10/2006 |
| KR | 10-0646160 | 11/2006 |
| KR | 10-0687007 | 2/2007 |
| KR | 10-0696547 | 3/2007 |
| KR | 10-0697663 B1 | 3/2007 |
| KR | 10-0698033 | 3/2007 |
| KR | 10-0700466 | 3/2007 |
| KR | 10-2007-0035796 | 4/2007 |
| KR | 10-0711885 | 4/2007 |
| KR | 10-0723627 | 5/2007 |
| KR | 10-2007-0056190 | 6/2007 |
| KR | 10-0726132 | 6/2007 |
| KR | 10-2007-0078713 | 8/2007 |
| KR | 10-2007-0080635 | 8/2007 |
| KR | 10-2007-0101842 | 10/2007 |
| KR | 10-2007-0105595 | 10/2007 |
| KR | 10-0770653 B1 | 10/2007 |
| KR | 10-2008-0001184 | 1/2008 |
| KR | 10-2008-0007896 | 1/2008 |
| KR | 10-0797787 | 1/2008 |
| KR | 10-0800125 | 1/2008 |
| KR | 10-0815265 B1 | 3/2008 |
| KR | 10-0823508 B1 | 4/2008 |
| KR | 10-2008-0044239 | 5/2008 |
| KR | 10-2008-0046761 | 5/2008 |
| KR | 10-0827760 | 5/2008 |
| KR | 10-0839380 | 6/2008 |
| KR | 10-2008-0060400 | 7/2008 |
| KR | 10-2008-0061132 | 7/2008 |
| KR | 10-2008-0062212 | 7/2008 |
| KR | 10-2009-0038733 | 4/2009 |
| KR | 10-2009-0079765 | 7/2009 |
| KR | 10-2009-0097453 | 9/2009 |
| KR | 10-2009-0098186 | 9/2009 |
| KR | 10-2010-0002381 | 1/2010 |
| KR | 10-1017654 B1 | 2/2011 |
| KR | 10-2012-0060498 A | 6/2012 |
| KR | 10-2013-0004830 A | 1/2013 |

OTHER PUBLICATIONS

Korean Patent Abstracts, Publication No. 10-2003-0013721 A, dated Feb. 15, 2003, for corresponding Korean Patent No. 10-0397635 B1, 13 pages.
EPO Search Report dated Sep. 6, 2010 for European Patent application 10250962.7, (5 pages).
EPO Search Report dated May 20, 2011 for European Patent application 10251404.9, (12 pages).
EPO Search Report dated May 13, 2011 for European Patent application 11250019.4, (6 pages).
EPO Search Report dated Oct. 11, 2012 for European Patent application 12174739.8, (5 pages).
JPO Office action dated Jan. 22, 2013 for Japanese Patent application 2010-116470, (3 pages).
JPO Office action dated Jan. 8, 2013 for Japanese Patent application 2011-000180, (3 pages).
JPO Office action dated Mar. 19, 2013 for Japanese Patent application 2011-097909, (3 pages).
JPO Office action dated Jan. 20, 2015 for Japanese Patent application 2011-118696, (5 pages).
KIPO Office action dated Jul. 1, 2011 for Korean Patent application 10-2009-0072111, (4 pages).
KIPO Office action dated Jun. 1, 2011 for Korean Patent application 10-2009-0050528, (4 pages).
KIPO Office action dated Apr. 9, 2012 for Korean Patent application 10-2010-0031556, (4 pages).
KIPO Registration Determination Certificate dated Oct. 27, 2011 for Korean Patent application 10-2010-0002381, (5 pages).
KIPO Registration Determination Certificate dated Sep. 23, 2011 for Korean Patent application 10-2009-0055473, (5 pages).
KIPO Registration Determination Certificate dated Sep. 28, 2011 for Korean Patent application 10-2009-0052359, (5 pages).
KIPO Registration Determination Certificate dated Sep. 28, 2011 for Korean Patent application 10-2009-0045200, (5 pages).
KIPO Registration Determination Certificate dated Sep. 28, 2011 for Korean Patent application 10-2009-0045201, (5 pages).
KIPO Notice of Allowance dated Apr. 26, 2012 for Korean Patent application 10-2010-0066991, (5 pages).
KIPO Registration Determination Certificate dated Jul. 2, 2012 for Korean Patent application 10-2010-0011480, (5 pages).
KIPO Registration Determination Certificate dated Jul. 2, 2012 for Korean Patent application 10-2010-0011481, (5 pages).
SIPO Office action dated Oct. 9, 2012, for Chinese Patent application 201010266406.6, (6 pages).
SIPO Office action dated Nov. 28, 2012, for Chinese Patent application 201110029291.3, (11 pages).
SIPO Certificate of Patent dated Jul. 31, 2013, for Chinese Patent application 201110199594.X, (31 pages).

(56) References Cited

OTHER PUBLICATIONS

U.S. Notice of Allowance dated Apr. 17, 2014 for U.S. Appl. No. 13/797,836, (10 pages).
U.S. Notice of Allowance dated Jun. 17, 2014 for U.S. Appl. No. 13/157,220, (36 pages).
U.S. Notice of Allowance dated Jun. 30, 2014 for U.S. Appl. No. 12/907,396, (40 pages).
U.S. Notice of Allowance dated Oct. 28, 2014 for U.S. Appl. No. 13/014,225, (64 pages).
U.S. Office action dated Jun. 21, 2011 for U.S. Appl. No. 12/862,153, (21 pages).
U.S. Office action dated Jun. 11, 2013 for U.S. Appl. No. 12/979,656, (50 pages).
U.S. Office action dated Dec. 13, 2011 for U.S. Appl. No. 12/849,193, (30 pages).
U.S. Office action dated Mar. 23, 2012 for U.S. Appl. No. 12/849,193, (17 pages).
U.S. Office action dated Oct. 3, 2012 for U.S. Appl. No. 12/869,830, (28 pages).
U.S. Office action dated Aug. 8, 2013 for U.S. Appl. No. 13/093,707 (7 pages).
U.S. Office action dated Jul. 24, 2013 for U.S. Appl. No. 12/784,804 (52 pages).
U.S. Office action dated Nov. 25, 2013 for U.S. Appl. No. 13/176,701 (49 pages).
U.S. Office action dated Dec. 31, 2014 for U.S. Appl. No. 12/873,556, (72 pages).
U.S. Office action dated Dec. 31, 2014 for U.S. Appl. No. 13/469,029 (74 pages).
U.S. Office action dated Nov. 14, 2014 for U.S. Appl. No. 13/178,472, (10 pages).
U.S. Office action dated Sep. 26, 2014 for U.S. Appl. No. 12/868,099, (66 pages).
U.S. Office action dated Mar. 16, 2015 for U.S. Appl. No. 13/654,378, (12 pages).
Korean Patent Abstracts for Korean Publication 10-2002-0086047, dated Nov. 18, 2002.
Korean Patent Abstracts for Korean Publication 10-2002-0088662, dated Nov. 29, 2002, corresponding to Korean Patent 10-0463212 dated Dec. 23, 2004.
Korean Patent Abstracts for Korean Publication 10-2005-0045619, dated May 17, 2005, corresponding to Korean Patent 10-0520159 dated Oct. 10, 2010.
Korean Patent Abstracts for Korean Publication 10-2004-0062203, dated Jul. 7, 2004, corresponding to Korean Patent 10-0646160 Nov. 14, 2006.
Korean Patent Abstracts for Korean Publication 10-2006-0101987, dated Sep. 27, 2006, corresponding to Korean Patent 10-0687007 Feb. 26, 2007.
Korean Patent Abstracts for Korean Publication 10-2002-0056238, dated Jul. 10, 2002, corresponding to Korean Patent 10-0698033 Mar. 23, 2007.
Korean Patent Abstracts for Korean Publication 10-2005-0078637, dated Aug. 5, 2005, corresponding to Korean Patent 10-0700466 Mar. 28, 2007.
Korean Patent Abstracts for Korean Publication 10-2007-0025164, dated Mar. 6, 2007, corresponding to Korean Patent 10-0711885 Apr. 25, 2007.
Korean Patent Abstracts for Korean Publication 10-2002-0034272, dated May 9, 2002, corresponding to Korean Patent 10-0726132 Jun. 12, 2007.
Korean Patent Abstracts for Korean Publication 10-2006-0126267, dated Dec. 7, 2006, corresponding to Korean Patent 10-0797787 Jan. 24, 2008.
Korean Patent Abstracts for Korean Publication 10-2008-0002189, dated Jan. 4, 2008, corresponding to Korean Patent 10-0800125 Jan. 31, 2008.
Korean Patent Abstracts for Korean Publication 10-2001-0062735, dated Jul. 7, 2001, corresponding to Korean Patent KR 10-0827760 May 7, 2008.
Korean Patent Abstracts for Korean Publication 10-2008-0038650, dated May 7, 2008, corresponding to Korean Patent KR 10-0839380 Jun. 19, 2008.
Korean Patent Abstracts for Korean Publication 10-2007-0050793, dated May 16, 2007, corresponding to Korean Patent 10-0815265 dated Mar. 19, 2008.
Patent Abstracts of Japan, and English machine translation of Japanese Publication 2001-52862 dated Feb. 23, 2001, (20 pages).
Patent Abstracts of Japan, and English machine translation of Japanese Publication 2003-3250 dated Jan. 8, 2003, (25 pages).
Patent Abstracts of Japan, and English machine translation of Japanese Publication 2004-349101 dated Dec. 9, 2004, (11 pages).

\* cited by examiner

DEPOSITION APPARATUS, METHOD OF MANUFACTURING ORGANIC LIGHT-EMITTING DISPLAY APPARATUS BY USING SAME, AND ORGANIC LIGHT-EMITTING DISPLAY APPARATUS MANUFACTURED BY USING DEPOSITION APPARATUS

CROSS-REFERENCE TO RELATED APPLICATION

This application claims priority to and the benefit of Korean Patent Application No. 10-2013-0043030, filed on Apr. 18, 2013, in the Korean Intellectual Property Office, the entire content of which is incorporated herein by reference.

BACKGROUND

1. Field

The present invention relates to a deposition apparatus, a method of manufacturing an organic light-emitting display apparatus by using the deposition apparatus, and an organic light-emitting display apparatus manufactured by using the deposition apparatus.

2. Description of the Related Art

An organic light-emitting display apparatus has aspects in that its viewing angle is wide, its contrast is excellent, and its response speed is fast, and thus the organic light-emitting display apparatus is receiving attention as a next-generation display apparatus.

The organic light-emitting display apparatus has a configuration that includes an intermediate layer between a first electrode and a second electrode that face each other, the intermediate layer including a light emitting layer. In this case, the first electrode, the second electrode, and the intermediate layer may be formed in many ways, one of which is an independent deposition method. In order to manufacture the organic light-emitting display apparatus by using a deposition method, a fine metal mask (FMM) with an opening which has the same/similar pattern as that of the intermediate layer is in close contact with a substrate on which the intermediate layer is to be formed, and a material of the intermediate layer is deposited to form the intermediate layer in a given pattern.

SUMMARY

A typical deposition method that uses a fine metal mask has a limitation in that when manufacturing a large-area organic light-emitting display apparatus by using a large-area substrate or simultaneously manufacturing a plurality of organic light-emitting display apparatuses by using a large-area mother substrate, a large-area fine metal mask (FMM) is used and in this case, a mask sags due to its own self weight and thus it is not possible to form an intermediate layer in a preset accurate pattern. Moreover, while aligning the large-area substrate with the large-area FMM so that they are in close contact and separating the substrate from the FMM after deposition, it takes a substantial amount of time and thus there are some limitations.

Aspects of embodiments of the present invention are directed toward a deposition apparatus, a method of manufacturing an organic light-emitting display apparatus by using the deposition apparatus, and an organic light-emitting apparatus manufactured by using the deposition apparatus that prevents a moving unit from sagging, thereby enabling precise deposition.

According to an embodiment of the present invention, a deposition apparatus includes: a transfer unit including a first transfer unit and a second transfer unit, wherein the first transfer unit is configured to transfer, in a first direction, a moving unit to which a substrate is detachably fixed, and the second transfer unit is configured to transfer, in an opposite direction of the first direction, the moving unit from which the substrate is separated, so that the moving unit is cyclically transferred by the first transfer unit and the second transfer unit; and a deposition unit including a deposition assembly and a housing, wherein the deposition assembly is configured to deposit a material on the substrate spaced apart from the deposition assembly while the first transfer unit transfers the substrate which is fixed to the moving unit, and the housing houses the deposition assembly and has an inner space through which the moving unit is transferred, and wherein the first transfer unit includes a first support unit that supports both ends of the moving unit in the first direction, and a second support unit that supports a side of the moving unit opposite to a side close to the deposition assembly.

The second support unit may be arranged on an upper inner space of the housing through which the moving unit is transferred when the first transfer unit transfers the moving unit, and the second support unit may be configured to apply an attractive force to the moving unit without direct contact with the moving unit when the moving unit is below the second support unit.

The second support unit may be configured to apply attractive force by using a magnetic field to the moving unit.

The second support unit may include an electromagnet.

The deposition apparatus may further include a gap sensor that measures a distance between the second support unit and the moving unit.

The second support unit may be arranged on an upper inner space of the housing through which the moving unit is transferred when the first transfer unit transfers the moving unit, and may include a guide rail configured to engage with a guide block of the moving unit when the moving unit is placed below the second support unit.

The deposition assembly may include a deposition source configured to radiate a deposition material; a deposition source nozzle unit arranged toward the first transfer unit from the deposition source and having a deposition source nozzle; and a patterning slit sheet arranged to face the deposition source nozzle unit and including a plurality of slits that are arranged along one direction; and wherein the deposition material radiated from the deposition source passes through the patterning slit sheet and is then deposited on the substrate that is fixed to the moving unit.

According to another embodiment of the present invention, a method of manufacturing an organic light-emitting display apparatus includes: transferring a moving unit into a chamber utilizing a first transfer unit configured to pass through the chamber, while a substrate is fixed to the moving unit, wherein the first transfer unit includes a coil, the moving unit includes a magnetic rail along a central line of the moving unit, and the magnetic rail and the coil form a linear motor; depositing a deposition material radiated from the deposition assembly on the substrate and forming a layer while the first transfer unit transports the substrate relative to the deposition assembly in a first direction when the deposition assembly and the substrate are spaced apart from each other in the chamber; separating the moving unit from the substrate; and returning the moving unit separated from the substrate utilizing a second transfer unit configured to pass through the chamber, and wherein the forming of the layer includes supporting two opposing ends of the moving unit in a second direction perpendicular to the first direction by using a first support unit, and supporting a side of the moving unit opposite to a side close to the deposition assembly by using a second support unit, the second support unit is laterally spaced apart from the magnetic rail along the central line of the moving unit and configured to balance a gravity in a central part of the moving unit.

The forming of the layer may include applying an attractive force to the moving unit without direct contact with the moving unit by the second support unit placed on an upper inner space of a housing through which the moving unit is transferred when the first transfer unit transfers the moving unit, when the moving unit is placed below the second support unit.

The forming of the layer may include applying the attractive force by using a magnetic field by the second support unit.

The forming of the layer may include applying the attractive force by using the magnetic field to the moving unit, the magnetic field being generated by an electromagnet included in the second support unit.

The forming of the layer may be performed while measuring a distance between the second support unit and the moving unit by using a gap sensor.

The forming of the layer may be performed while regulating an intensity of the attractive force which the second support unit applies to the moving unit to keep the distance between the second support unit and the moving unit constant, the distance being measured by using the gap sensor.

The forming of the layer may be performed while aligning a guide rail with a guide block of the moving unit, the guide rail being placed on an upper inner space of the housing through which the moving unit is transferred when the first transfer unit transfers the moving unit.

The forming of the layer may include transferring a deposition material radiated from a deposition source of the deposition assembly to a deposition source nozzle unit of the deposition assembly near the first transfer unit and then to a patterning slit sheet of the deposition assembly that is arranged to face the deposition source nozzle units and includes a plurality of patterning slits arranged along one direction, and depositing the deposition material on the substrate fixed to the moving unit.

According to another embodiment of the present invention, an organic light-emitting display apparatus includes: a substrate; a plurality of thin film transistors (TFTs) on the substrate; a plurality of pixel electrodes electrically connected to the TFTs; a plurality of deposition layers on the pixel electrodes; and counterpart electrodes on the plurality of deposition layers, wherein at least one of the plurality of deposition layers has a linear pattern that is formed by using the above-described deposition apparatus.

The substrate may have a size equal to or larger than 40 inches.

BRIEF DESCRIPTION OF THE DRAWINGS

The above and other features and aspects of the present invention will become more apparent by describing in more detail some example embodiments thereof with reference to the attached drawings in which.

DETAILED DESCRIPTION

Figure 1:
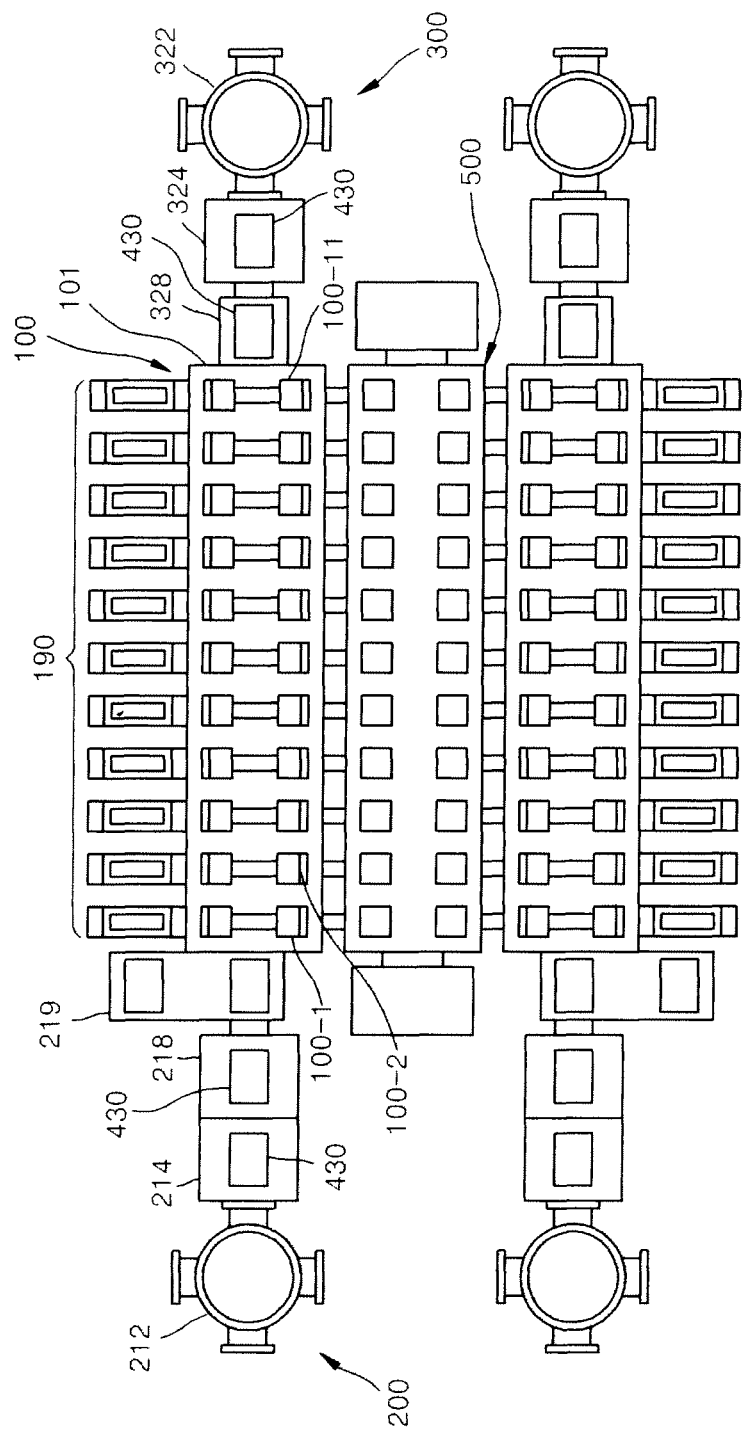
FIG. 1 is a schematic plan view of a deposition apparatus according to an embodiment of the present invention.

As used herein, the term "and/or" includes any and all combinations of one or more of the associated listed items. Expressions such as "at least one of," when preceding a list of elements, modify the entire list of elements and do not modify the individual elements of the list.

Embodiments of the present invention will now be described in more detail with reference to the accompanying drawings, in which example embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. In the drawings, the dimensions of components may be exaggerated or reduced for convenience of illustration. For example, because the size and thickness of each component in the drawings is arbitrarily represented for convenience of illustration, the present invention is not limited thereto.

In the following embodiments, the x axis, y axis, and z axis are not limited to three axes on a rectangular coordinate system but may be construed as having a wider meaning including them. For example, the x axis, y axis and z axis may be orthogonal to one another but may refer to different directions that are not orthogonal to one another.

When any of various components such as a layer, a film, an area, a plate, etc. is referred to as being 'on' another layer or substrate, it can be directly on the other layer or substrate, or intervening layers may also be present.

Figure 2:
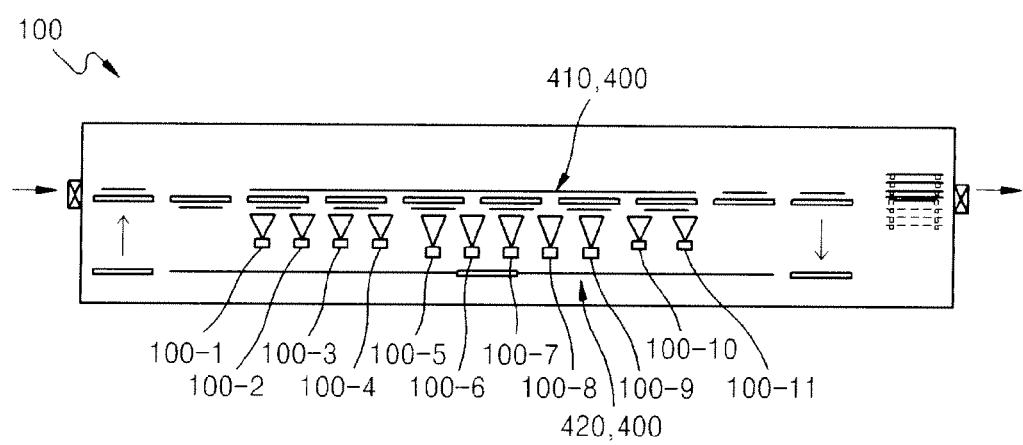
FIG. 2 is a schematic side view of a deposition unit of the deposition apparatus of FIG. 1.

FIG. 1 is a schematic plan view of a deposition apparatus according to an embodiment of the present invention, and FIG. 2 is a schematic side view of a deposition unit of the deposition apparatus of FIG. 1.

Referring to FIGS. 1 and 2, the deposition apparatus according to the present embodiment includes a transfer unit 400 and a deposition unit 100. The deposition apparatus may include other components such as a loading unit 200, an unloading unit 300, and a patterning slit sheet replacing unit 500 as needed. The transfer unit 400 may include a first transfer unit 410 that may transfer, in a first direction, a moving unit 430 to which a substrate 2 (see FIG. 3) is detachably fixed, and a second transfer unit 420 that may transfer, in the opposite direction to the first direction, the moving unit 430 from which the substrate 2 is separated.

The loading unit 200 may include a first rack 212, an introduction chamber 214, a first inversion chamber 218, and a buffer chamber 219.

A plurality of substrates 2 before deposition is loaded on the first rack 212. An introduction robot picks up a substrate 2 from the first rack 212, and the substrate 2 is mounted on the moving unit 430 that is transferred and placed in the introduction chamber 214 by the second transfer unit 420. The substrate 2 may be fixed to the moving unit 430 by a clamp, and the moving unit 430 to which the substrate 2 is fixed is moved to the first inversion chamber 218. It is possible to include the process of aligning the substrate 2 with the moving unit 430 before fixing the substrate 2 to the moving unit 430, as needed.

A first inversion robot inverts the moving unit 430 in the first inversion chamber 218 that is near the introduction chamber 214. Here, the introduction robot places the substrate 2 on the top of the moving unit 430, and the moving unit 430 is transferred to the first inversion chamber 218 while a side of the substrate 2 opposite to a side close to the moving unit 430 faces upwards. As the first inversion robot inverts the first inversion chamber 218, the side of the substrate 2 opposite to the side close to the moving unit 430 faces downwards. In this state, the first transfer unit 410 transfers the moving unit 430 to which the substrate 2 is fixed.

The unloading unit 300 is configured in the opposite way to the loading unit 200 described above. Here, a second inversion robot inverts, in the second inversion chamber 328, the substrate 2 and the moving unit 430 (after passing through the deposition unit 100) and transfers them to a discharging chamber 324. Then, the substrate 2 is separated from the moving unit 430 in the discharging chamber 324, and a discharging robot loads the separated substrate 2 on the second rack 322. The second transfer unit 420 transfers the moving unit 430 from which the substrate 2 is separated, and returns it to the loading unit 200.

The present invention is not limited to such configurations, and the substrate 2 may be fixed to the bottom of the moving unit 430 when being fixed for the first time and may be transferred as it is. In this case, there may be no need for the first inversion robot in the first inversion chamber 218 and the second inversion robot in the second inversion chamber 328. In addition, the first inversion robot in the first inversion chamber 218 and the second inversion robot in the second inversion chamber 328 may not invert the first inversion chamber 218 or the second inversion chamber 328 but may invert, in the first inversion chamber 218 or the second inversion chamber 328, only the moving unit 430 to which the substrate 2 is fixed. In this case, it is possible to rotate a transfer unit through 180 degrees in an inversion chamber while the moving unit 430 is placed on the transfer unit that may transfer the moving unit 430 to which the substrate 2 is fixed. In this case, it may be understood that the transfer unit in the inversion chamber also functions as the first inversion robot or the second inversion robot. The transfer unit in the inversion chamber may be a part of a first transfer unit or a part of a second transfer unit.

The deposition unit 100 may include a chamber 101 as shown in FIG. 1 and FIG. 2, and a plurality of deposition assemblies 100-1 to 100-n may be arranged in the chamber 101. Although FIG. 1 shows that eleven deposition assemblies, that is, a first deposition assembly 100-1 to an eleventh deposition assembly 100-11, are arranged in the chamber 101, the number of the deposition assemblies may vary depending on a deposition material and a deposition condition. The chamber 101 may be kept in a vacuum or near-vacuum state while deposition is performed.

The first transfer unit 410 transfers, at least to the deposition unit 100, the moving unit 430 to which the substrate 2 is fixed, and may sequentially transfer it to the loading unit 200, the deposition unit 100, and the unloading unit 300. The second transfer unit 420 returns, to the loading unit 200, the moving unit from which the substrate 2 is separate in the unloading unit 300. Accordingly, the moving unit 430 may be cyclically transferred by the first transfer unit 410 and the second transfer unit 420.

The first transfer unit 410 may be arranged to pass through the chamber 101 when passing through the deposition unit 100, and the second transfer unit 420 may be arranged to transfer the moving unit 430 from which the substrate 2 is separated.

In this case, the first transfer unit 410 may be arranged over the second transfer unit 420. Accordingly, the moving unit 430 that is deposited with the substrate 2 is separated from the substrate 2 in the unloading unit 300 (after passing through the deposition unit 100 on the first transfer unit 410) and the moving unit 430 is then returned to the loading unit 200 through the second transfer unit 420 that is arranged under the first transfer unit 410. Thus, it is possible to obtain an effect of enhancing space utilization efficiency. The second transfer unit 420 may be placed over the first transfer unit 410, unlike the embodiment shown in FIG. 2.

As shown in FIG. 1, the deposition unit 100 may include a deposition source replacing unit 190 that is arranged on one side of each deposition assembly 100-1. Although not shown in detail, the deposition source replacing unit 190 may be formed in a cassette type so that it may be drawn from each deposition assembly 100-1 to the outside. Accordingly, it may be easy to replace a deposition source 110 (see 110a and 110b in FIG. 3) of the deposition assembly 100-1.

In addition, FIG. 1 shows that two deposition apparatuses including the loading unit 200, the deposition unit 100, the unloading unit 300, and the transfer unit 400 are arranged side by side. In this case, the patterning slit sheet replacing unit 500 may be arranged between the two deposition apparatuses. That is, the two deposition apparatuses jointly use the patterning slit sheet replacing unit 500 to be able to enhance space utilization efficiency as compared with when each of the deposition apparatuses includes the patterning slit sheet replacing unit 500.

Figure 3:
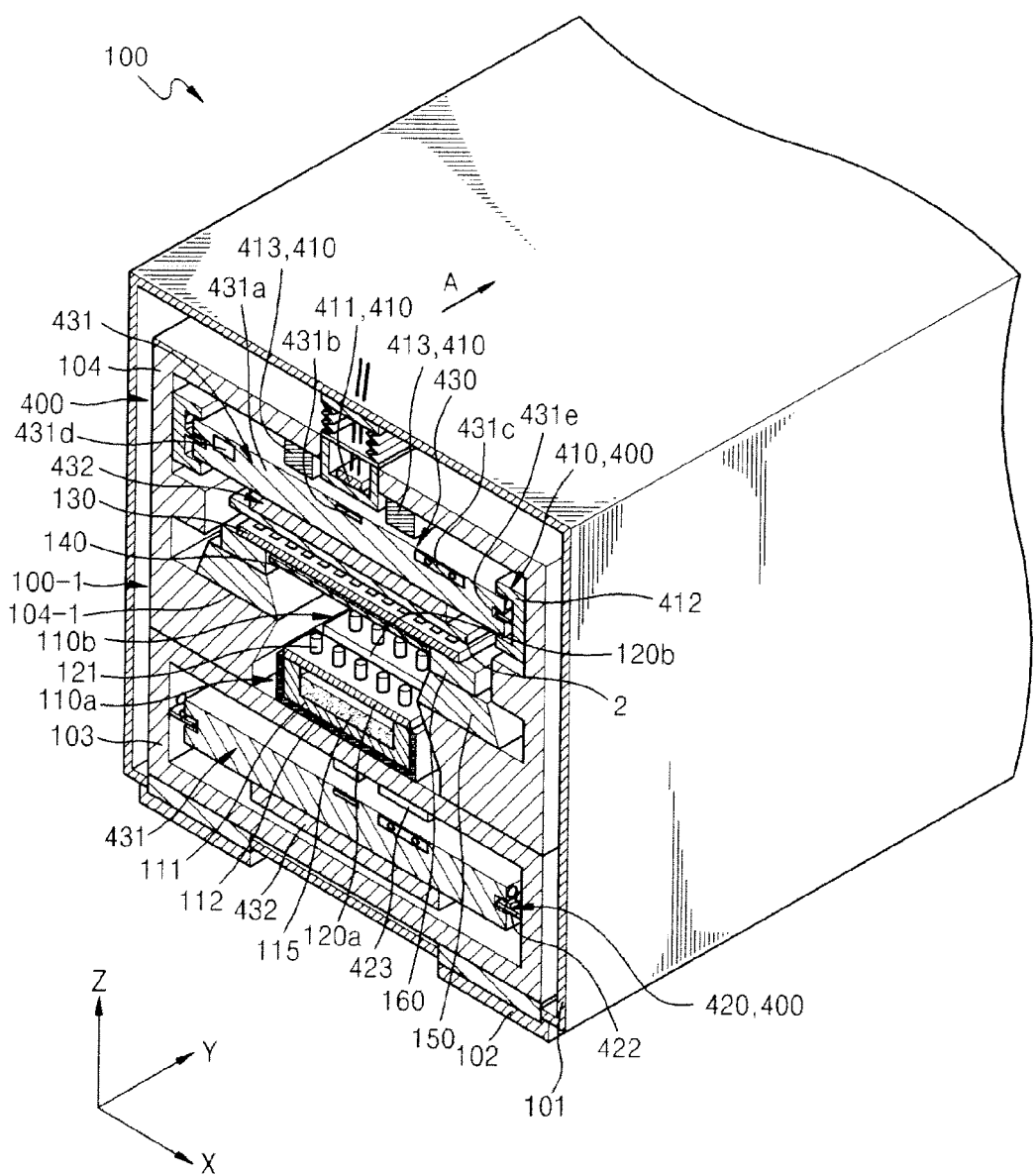
FIG. 3 is a schematic perspective view of a part of the deposition unit of the deposition apparatus of FIG. 1.
Figure 4:
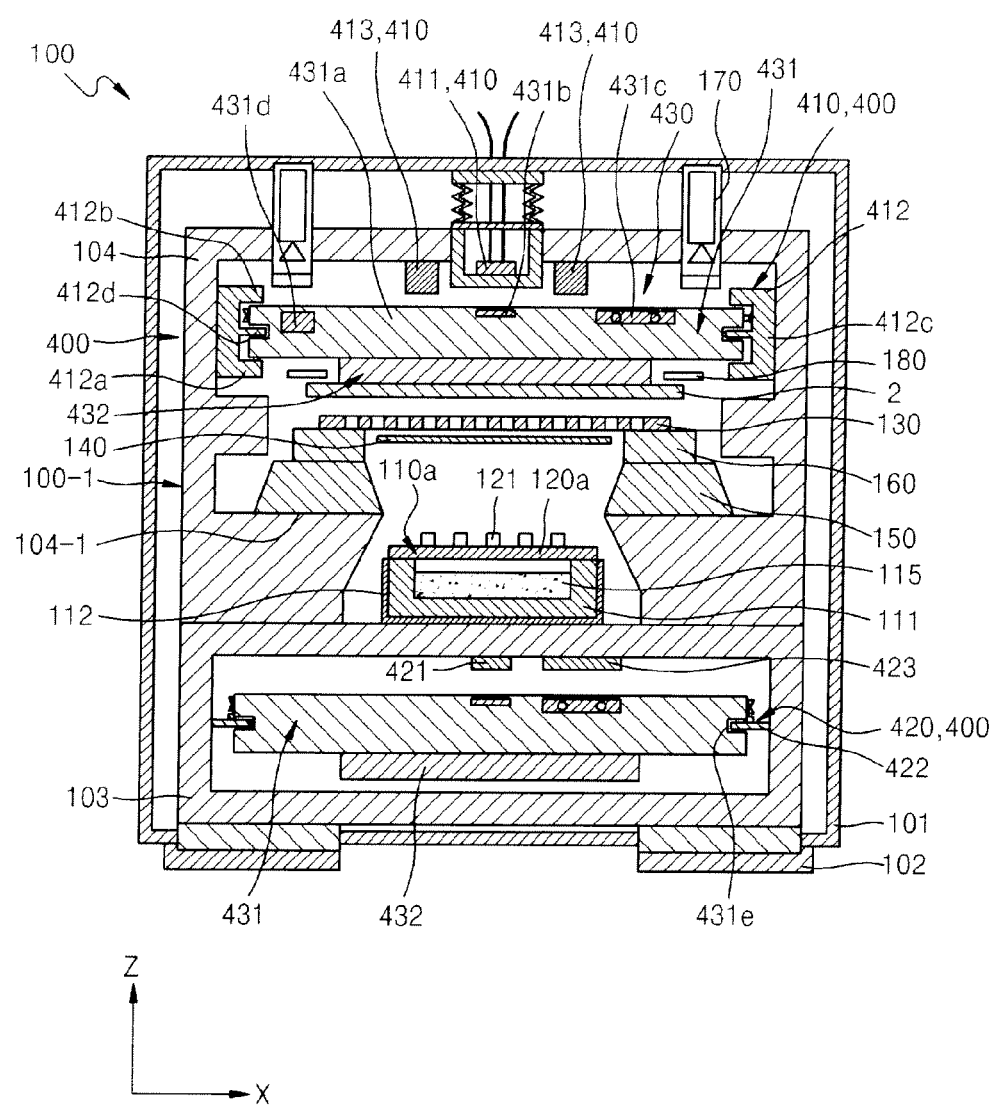
FIG. 4 is a schematic sectional view of a part of the deposition unit of the deposition apparatus of FIG. 1.
Figure 5:
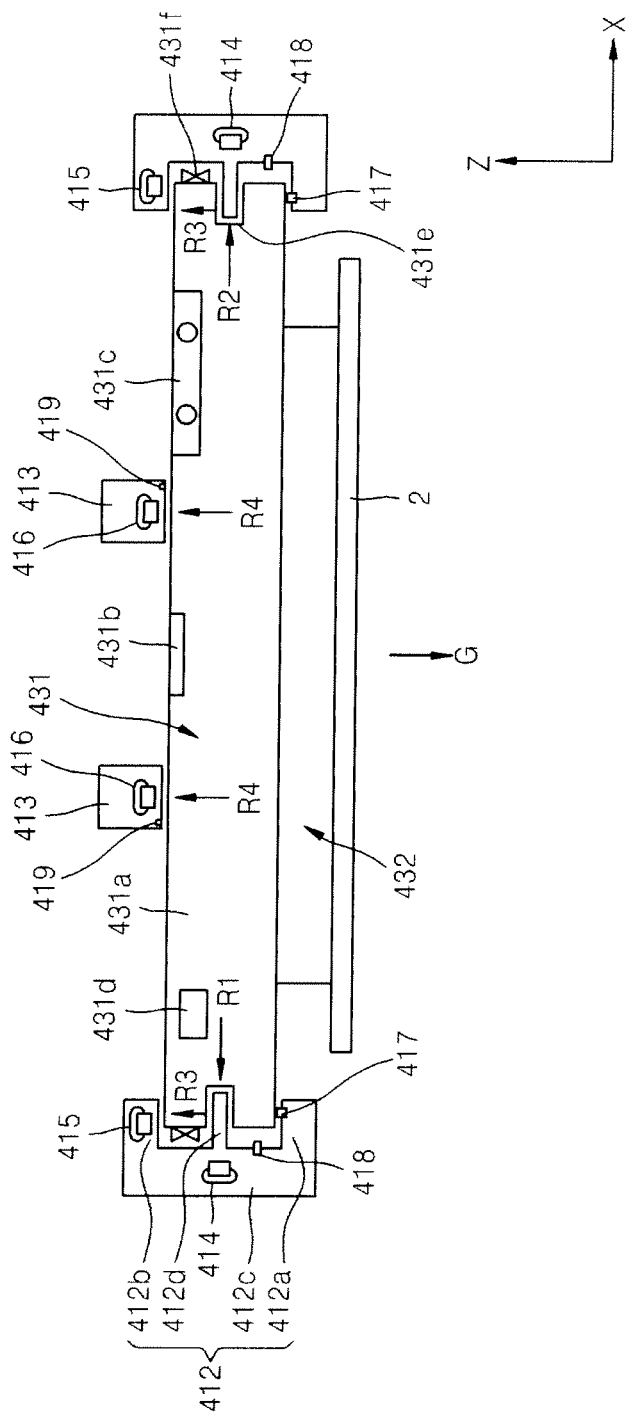
FIG. 5 is a schematic front view of a part of the deposition unit of the deposition apparatus of FIG. 1.

FIG. 3 is a schematic perspective view of a part of the deposition unit 100 of the deposition apparatus of FIG. 1, FIG. 4 is a schematic sectional view of a part of the deposition unit 100 of the deposition apparatus of FIG. 1, and FIG. 5 is a schematic front view of a part of the deposition unit 100 of the deposition apparatus of FIG. 1.

Referring to FIGS. 3 to 5, the deposition unit 100 of the deposition apparatus according to the present embodiment includes the chamber 101, one or more deposition assemblies 100-1, and a lower housing 103 and an upper housing 104 in which the deposition assembly 100-1 are arranged and have inner spaces through which the moving unit 430 may pass.

The chamber 101 is formed to have an empty box shape and includes one or more deposition assemblies 100-1. The transfer unit 400 may be housed in the chamber 101 as shown and in some cases, a part of the transfer unit 400 may be arranged in the chamber 101 and other parts thereof may be outside the chamber 101.

The chamber 101 may include a lower housing 103 and an upper housing 104. In particular, the lower housing 103 may be arranged on a foot 102 that may be fixed to the ground, and the upper housing 104 may be arranged on the lower housing 103. In this case, a connection unit of the lower housing 103 and the chamber 101 may be sealed so that the chamber 101 is completely closed. As such, the lower housing 103 and the upper housing 104 are arranged on the foot 102 fixed to the ground so that the lower housing 103 and the upper housing 104 may maintain fixed locations even if the chamber 101 repeats contraction/expansion. Thus, the lower housing 103 and the upper housing 104 may function as a kind of a reference frame in the deposition unit 100.

The deposition assembly 100-1 and the first transfer unit 410 of the transfer unit 400 may be arranged in the upper housing 104 and the second transfer unit 420 of the transfer unit 400 may be arranged in the lower housing 103. The upper housing 104 has an inner space through which the moving unit 430 may be transferred by the first transfer unit 410, and the lower housing 103 also has an inner space through which the moving unit may be transferred by the second transfer unit 420. While the moving unit 430 is cyclically transferred by the first transfer unit 410 and the second transfer unit 420, deposition may be continuously performed on the substrate 2 which is fixed to the moving unit 430. As such, the moving unit 430 that may be cyclically transferred may include a carrier 431 and an electrostatic chuck 432 coupled thereto.

The carrier 431 may include a main unit 431a, a linear motor system (LMS) magnet 431b, a contactless power supply (CPS) module 431c, a power supply 431d, and a guide groove 431e. The carrier 431 may further include a cam follower 431f (see FIG. 5) as needed.

The main unit 431a forms the base unit of the carrier 431 and may include a magnetic material such as steel. The main unit 431a of the carrier 431 may allow the carrier 431 to be spaced apart from the guide unit 412 of the first transfer unit 410 by an attractive or repulsive force with respect to magnetic levitation bearings 414 to 416 (see FIG. 5) that are included in the first transfer unit 410. In addition, guide grooves 431e may be formed on both sides of the main unit 431a. Such a guide groove 431e may house a guide protrusion 412d of the guide unit 412 of the first transfer unit 410 or a roller guide 422 of the second transfer unit 420.

Furthermore, the main unit 431a may include a magnetic rail 431b that is arranged along the central line of its moving direction (Y direction). The magnetic rail 431b of the main unit 431a may form a linear motor along with a coil 411 of the first transfer unit 410, and the carrier 431 or the moving unit 430 may be transferred in the A direction by such a linear motor. Accordingly, even if the moving unit 430 does not include a separate power supply, it may be transferred by currents that are applied to the coil 411 of the first transfer unit 410. To this end, a plurality of coils 411 may be arranged at a given interval in the chamber 101 (along the Y direction). The coil 411 may be arranged in an atmosphere box and installed in an atmospheric pressure.

The main unit 431a may include the CPS module 431c and the power supply 431d that are arranged on one and the other sides of the magnetic rail 431b. The power supply 431d includes a rechargeable battery for supplying power to be able to chuck and maintain the substrate 2, and the CPS module 431c is a wireless rechargeable module for recharging the rechargeable battery of such a power supply 431d. A charging track 423 which the second transfer unit 420 has is connected to an inverter, and thus when the second transfer unit 420 transfers the carrier 431, a magnetic field may be formed between the charging track 423 and the CPS module 431c to supply power to the CPS module 431c and accordingly, the power supply 431d may be charged.

The electrostatic chuck 432 may have a main unit formed of ceramic and an electrode that is in the main unit and supplies power. Such an electrostatic chuck 432 may attach the substrate to a surface of its main unit because a high voltage is supplied from the power supply 431d in the main unit 431a of the carrier 431 to the electrode in the main unit of the electrostatic chuck.

The first transfer unit 410 may have such a configuration and transfer, in the first direction (+Y direction), the moving unit 430 to which the substrate 2 is fixed. The first transfer unit 410 may include the coil 411 and the guide unit 412 that are described above, and may further include magnetic levitation bearings 414 to 416 (see FIG. 5) or gap sensors 417 to 419 (see FIG. 5).

Both the coil 411 and the guide unit 412 may be arranged on an inner surface of the upper housing 104. For example, the coil 411 may be arranged on an upper inner surface of the upper housing 104 and the guide unit 412 may be arranged on inner surfaces of both sides of the upper housing 104.

The coil 411 may form a linear motor along with the magnetic rail 431b of the main unit 431a of the moving unit 430 to move the moving unit 430 as previously described. The guide unit 412 may guide and transfer the moving unit 430 in the first direction (Y-axis direction) when the moving unit 430 moves. Such a guide unit 412 may be arranged through the deposition unit 100.

In particular, the guide unit 412 may house both sides of the carrier 431 of the moving unit 430 and guide the carrier so that the carrier 431 may move in the A direction of FIG. 3. To this end, the guide unit 412 may have a first housing unit 412a that is arranged under the carrier 431, a second housing unit 412b that is arranged over the carrier 431, and a connecting unit 412c that connects the first housing unit 412a to the second housing unit 412b. A housing groove may be formed by the first housing unit 412a, the second housing unit 412b, and the connecting unit 412c, and the guide unit 412 may have the guide protrusion 412d in the housing groove.

Side magnetic levitation bearings 414 may be respectively arranged in the connecting units 412c of the guide units 412 to face both sides of the carrier 431 in the first direction (+Y direction) that the moving unit 430 to which the substrate 2 is fixed is transferred. The side magnetic levitation bearing 414 may form an interval between the carrier 431 and the guide unit 412 so that the carrier 431 may be transferred along the guide unit 412 without contact with the guide unit 412. Because an attractive/repulsive force R1 between one side magnetic levitation bearing 414 and the carrier 431 and an attractive/repulsive force between the other side levitation bearing 414 and the carrier 431 are balanced relative to each other, it is possible to form the interval between the carrier 431 and the guide unit 412 and also keep the interval constant.

Upper magnetic levitation bearings 415 may be respectively arranged in the second housing unit 412b of the guide unit 412 to be placed on the upper parts of both ends of the carrier 431 in the first direction (+Y direction) that the moving unit 430 to which the substrate 2 is fixed is transferred.

The upper magnetic levitation bearing 415 may move the carrier 431 along the guide unit 412 while the carrier maintains given intervals with respect to the first housing unit 412a and second housing unit 412b of the guide unit 412 without contacting them. That is, since an attractive force R3 between the upper magnetic levitation bearing 415 and the carrier 431 and gravity G are balanced relative to each other, it is possible to form the interval between the carrier 431 and the guide unit 412 and also keep the interval constant. Lower magnetic levitation bearings in place of the upper magnetic levitation bearings 415 may be respectively arranged in the first housing unit 412a of the guide unit 412 to be placed on the lower parts of both ends of the carrier 431. In this case, a repulsive force between the lower magnetic levitation bearing and the carrier 431 and gravity G may be balanced relative to each other.

Top magnetic levitation bearings 416 may be arranged in a top guide unit 413 that is a component of the first transfer unit 410, protrudes into the inner space through which the moving unit 430 in the upper housing 104 may pass, and is extended in a direction (+Y direction) that the moving unit 430 is transferred. Such a top magnetic levitation bearing 416 may prevent the central part of the carrier 431 from sagging in a lower direction (−Z direction) due to gravity. That is, because the attractive force R4 between the top magnetic levitation bearing 416 and the carrier 431 and gravity G are balanced relative to each other, it is possible to prevent the central part of the carrier 431 from sagging in the lower direction due to gravity.

As a size of an organic light-emitting display apparatus to be manufactured increases, there is a desire to use a large-area substrate in the manufacturing process. In addition, if a plurality of organic light-emitting display apparatuses are concurrently (e.g., simultaneously) manufactured by using one mother substrate, there is a desire to use a large-area mother substrate in order to concurrently (e.g., simultaneously) manufacture more organic light-emitting display apparatuses.

In this case, a size of the moving unit 430 or the carrier 431 also would increase and accordingly, there may be a limitation in that the central part of the moving unit 430 or the carrier 431 sags due to its own weight. If the central part of the moving unit 430 or the carrier 431 sags due to its own weight, the interval between a patterning slit sheet 130 to be described below and the substrate 2 is not constant or does not match a preset interval and thus there may be limitations in that the deposition is not accurately performed and a manufacturing yield decreases.

However, if the deposition apparatus according to the present embodiment is used, the top magnetic levitation bearing 416 may prevent the central part of the carrier 431 from sagging in a lower direction (−Z direction) due to gravity and thus the deposition may be performed on a correct location and in an accurate pattern even if the deposition is performed on a large-area substrate 2 so that a manufacturing yield may increase (e.g., increase dramatically).

Although FIG. 5 shows that in a plane (ZX plane) perpendicular to the first direction (+Y direction) that the first transfer unit 410 transfers the moving unit 430, the first transfer unit 410 has two top magnetic levitation bearings 416 in the upper housing 104 as components of a second support unit, the present invention is not limited thereto. That is, in the plane (ZX plane) perpendicular to the first direction (+Y direction) that the first transfer unit 410 transfers the moving unit 430, there may be other variations applied thereto and for example, the first transfer unit may have one top magnetic levitation bearing 416 or have more than two top magnetic levitation bearings 416.

In order to check the interval between the carrier 431 and the guide unit 412 and/or the carrier 431 and the top guide unit 413, the guide unit 412 may have a vertical gap sensor 417 arranged in the first housing unit 412a to face the lower part of the carrier 431 and/or a lateral gap sensor 418 arranged on the connecting unit 412c, and the top guide unit 413 may have a top gap sensor 419.

The magnetism of magnetic levitation bearings 414 to 416 may vary depending on values measured by such gap sensors 417 to 419 so that the interval between the carrier 431 and the guide unit and/or the interval between the carrier 431 and the top guide unit 413 is regulated in real time. That is, the carrier 431 may be precisely transferred by feedback control using the magnetic levitation bearings 414 to 416 and the gap sensors 417 to 419. To this end, in order to be able to regulate the intensity of the attractive force applied to the carrier 431 by the magnetic levitation bearings 414 to 416, the magnetic levitation bearings 414 to 416 may include electromagnets.

The second transfer unit 420 plays a role in returning, to the loading unit 200, the moving unit 430 from which the substrate 2 is separated in the unloading unit 300 after the moving unit passes through the deposition unit 100 and the deposition is completed. Such a second transfer unit 420 may include a coil 421 arranged in the lower housing 103, a roller guide 422, and the above-described charging track 423. For example, the coil 421 and the charging track 423 may be arranged on the upper inner surface of the lower housing 103 and the roller guide 422 may be arranged on the inner surfaces of both sides of the lower housing 103. Although not shown, the coil 421 may be arranged in an atmosphere box like the coil 411.

The coil 421 may form a linear motor along with the magnetic rail 431b of the carrier 431 of the moving unit 430, like the coil 411. The moving unit 430 may be transferred in the opposite direction (−Y direction) to the first direction (+Y direction) by the linear motor.

The roller guide 422 plays a role in guiding the carrier 431 so that it moves in the opposite direction to the first direction. Such a roller guide 422 may be arranged through the deposition unit 100. The roller guide 422 may play roles in supporting the cam followers 431f arranged on both sides of the carrier 431 of the moving unit 430 and guiding the moving unit 430 so that it is transferred in the opposite direction (−Y direction) of the first direction (+Y direction).

Because the second transfer unit 420 plays a role in returning, to the loading unit 200, the moving unit 430 from which the substrate 2 is separated, the transferring of the moving unit 430 does not need high position precision as compared to the first transfer unit 410 that transfers the moving unit 430 to which the substrate 2 is fixed, to deposit some material on the substrate 2. Thus, a magnetic levitation function may be applied to the first transfer unit 410 that needs high position precision for transferring the moving unit 430 and a typical roller technique may be applied to the second transfer unit 420 to simplify a configuration of the deposition apparatus and reduce the manufacturing costs. It is also possible to apply the magnetic levitation function to the second transfer unit 420 if necessary or desired.

The deposition assembly 100-1 is spaced apart from the substrate and deposits a material on the substrate 2 while the first transfer unit 410 transfers, in the first direction (+Y direction), the substrate 2 which is fixed to the moving unit 430. Detailed components of the deposition assembly 100-1 will be described below.

Each deposition assembly 100-1 may include deposition sources 110a and 110b, deposition source nozzle units 120a and 120b, a patterning slit sheet 130, a closing member 140, a first stage 150, a second stage 160, a camera (or cameras) 170, and a sensor (or sensors) 180. In this case, most of the components shown in FIGS. 3 and 4 may be arranged in the chamber 101 which maintains an appropriate degree of vacuum. The reason for this is to obtain the linearity of a deposition material.

The deposition sources 110a and 110b may radiate deposition materials. The deposition assembly 100-1 of the deposition apparatus according to the present embodiment has a first deposition source 110a and a second deposition source 110b that are arranged along the first direction (+Y direction) to be sequentially approached when the first transfer unit 410 transfers the substrate 2 which is fixed to the moving unit 430. Unlike FIG. 3, more than two deposition sources may be arranged or only one deposition source may be arranged. Such deposition sources 110a and 110b may be arranged at lower parts to radiate a deposition material to the substrate 2 (e.g., in the +Z direction, namely upwards) as the deposition materials 115 that are held in the deposition sources are liquefied/gasified. In particular, the deposition sources 110a and 110b may include a crucible 111 in which the deposition material 115 is filled, and a heater 112 that heats the crucible 111 and evaporates the deposition material 115 from the crucible 111.

The deposition source nozzle units 120a and 120b with deposition source nozzles 121 are arranged toward the first transfer unit 410 (in the +Z direction), namely toward the substrate 2. In particular, the first deposition source nozzle unit 120a is arranged toward the first transfer unit 410 from the first deposition source 110a and the second deposition source nozzle unit 120b is arranged toward the first transfer unit 410 from the second deposition source 110b. FIGS. 3 and 4 show an embodiment when the nozzle units 120a and 120b have a plurality of deposition source nozzles 121.

Although FIG. 3 shows that the first deposition source nozzle unit 120a is separated from the second deposition source nozzle unit 120b, the present invention is not limited thereto. For example, the first deposition source 110a and the second deposition source 110b may be mounted in an open top container, and one deposition source nozzle unit that includes a deposition source nozzle for the first deposition source 110a and a deposition source nozzle for the second deposition source 110b may be placed on the container. That is, the first deposition source nozzle unit 120a and the second deposition source nozzle unit 120b may be integral. For convenience, a case where the first deposition source nozzle unit 120a is separate from the second deposition source nozzle unit 120b will be described below.

The patterning slit sheet 130 may be arranged to face the deposition source nozzle units 120a and 120b and have a structure in which a plurality of patterning slits are formed along one direction (X-axis direction). Such a patterning slit sheet 130 is placed between the deposition sources 110a and 110b and the substrate 2. The deposition material 115 gasified from the deposition sources 110a and 110b may pass through the deposition source nozzle units 120a and 120b and the patterning slit sheet 130 and be deposited on the substrate 2 which is a deposition target. If there is a need for a uniform deposition layer on the entire surface of the substrate 2, the patterning slit sheet 130 may have an opening extended along the X axis, rather than a plurality of patterning slits.

The patterning slit sheet 130 may be manufactured by using an etching technique that is used in a method of manufacturing a typical fine metal mask (FMM), in particular, a stripe-type mask. Such a patterning slit sheet 130 may be spaced apart from the deposition sources 110a and 110b (and the deposition source nozzle units 120a and 120b coupled thereto).

In order for the deposition material 115 emitted from the deposition sources 110a and 110b to pass through the deposition source nozzle units 120a and 120b and the patterning slit sheet 130 and to be deposited on the substrate in a desired pattern, the chamber needs to maintain a high vacuum state equal/similar to the FMM deposition case. In addition, the temperature of the patterning slit sheet 130 needs to be sufficiently lower than those of the deposition sources 110a and 110b (below about 100° C.). The reason for this is that it is possible to reduce or minimize a thermal expansion of the patterning slit sheet 130 due to a temperature only if the temperature of the patterning slit sheet 130 is sufficiently low. That is, if the temperature of the patterning slit sheet 130 rises, a size or position of the patterning slit of the patterning slit sheet 130 changes due to thermal expansion and thus deposition may be performed in a different pattern from the preset pattern on the substrate 2.

In the case of the typical deposition technique that uses the FMM, an area of the FMM is the same as that of the substrate as previously described. Thus, there are some limitations in that as the size of the substrate increases, the FMM also increases in size and thus it is not easy to manufacture the FMM, and it is difficult to form an intermediate layer accurately in a preset pattern because the mask sags due to the self weight of the FMM.

However, in the case of the deposition apparatus according to the present embodiment, the deposition assembly 100-1 and the substrate 2 make a relative movement to perform the deposition. In particular, while the first transfer unit 410 transfers, in the first direction (+Y direction), the substrate 2 which is fixed to the moving unit 430, the deposition assembly 100-1 which is spaced apart from the substrate 2 deposits a material on the substrate 2. In other words, while the substrate 2 arranged to face the deposition assembly 100-1 is transferred in the direction indicated by arrow A, deposition is performed in a scanning manner. FIG. 3 shows that the deposition is performed while the substrate 2 moves in the chamber 101 in the +Y direction; however, the present invention is not limited thereto. For example, the deposition may be performed while the substrate 2 is fixed and the deposition assembly 100-1 moves in the −Y direction, and there may be other variations applied thereto.

Thus, in the case of the deposition apparatus according to the present embodiment, the size of the patterning slit sheet 130 may be smaller (e.g., much smaller) than that of the typical FMM. That is, in the case of the deposition apparatus according to the present embodiment, because deposition is performed continuously or in a scanning manner while the substrate 2 moves in the Y-axis direction, deposition may be sufficiently performed on almost the entire surface of the substrate 2 even if the length of the Y-axis direction of the patterning slit sheet 130 is less (e.g., much less) than that of the Y-axis direction of the substrate 2.

Because it is possible to reduce (e.g., significantly reduce) a size of the patterning slit sheet 130 as compared to that of the typical FMM, it is relatively easy to manufacture the patterning slit sheet 130. That is, in all processes including an etching process, subsequent precise stretching and welding processes, and moving and cleaning processes, the processes related to the manufacturing of a patterning slit sheet 130 of a small size is more advantageous as compared to the processes related to the manufacturing of a large-area FMM. Such an advantage increases as a display apparatus to be manufactured becomes large.

The deposition assembly 100-1 is spaced apart from the substrate 2 and deposits a material on the substrate 2 while the first transfer unit 410 transfers, in the first direction (+Y direction), the substrate 2 which is fixed to the moving unit, as previously described. This indicates that the patterning slit sheet 130 is arranged so that it is spaced apart from the substrate 2. In the case of the typical deposition apparatus using the FMM, it has a limitation in that the FMM is in contact with the substrate and thus a fault occurs, but in the case of the deposition apparatus according to the present embodiment, such a limitation may be effectively prevented and in addition, because a process to make the substrate in contact with the mask is not needed, it is possible to increase (e.g., dramatically increase) a manufacturing speed.

The upper housing 104 may have protruding mount units 104-1 on both sides of the deposition sources 110a and 110b and the deposition source nozzle units 120a and 120b as shown. A first stage 150 and a second stage 160 may be arranged on the mount units 104-1 and the patterning slit sheet 130 may be arranged on the second stage 160.

The first stage 150 may adjust the positions of the patterning slit sheet 130 in the X-axis direction and in the Y-axis direction. That is, the first stage 150 may include a plurality of actuators and move the position of the patterning slit sheet 130 with respect to the upper housing 104 in the X-axis direction and in the Y-axis direction. The second stage 160 may adjust the position of the patterning slit sheet 130 in the Z-axis direction. For example, the second stage 160 may include an actuator and adjust the position of the patterning slit sheet 130 with respect to the first stage 150 or the upper housing 104 in the Z-axis direction.

By adjusting the position of the patterning slit sheet 130 with respect to the substrate 2 by using the first stage 150 and the second stage 160, it is possible to make an alignment between the substrate 2 and the patterning slit sheet 130, in particular, a real-time alignment.

In addition, the upper housing 104, the first stage 150, and the second stage 160 may concurrently (e.g., simultaneously) play a role in guiding the moving path of a deposition material so that the deposition material emitted through the deposition source nozzle 121 is not scattered. That is, because the path of the deposition material is limited by the upper housing 104, the first stage 150 and the second stage 160, it is possible to preclude the deposition material from being scattered in the X-axis direction.

The deposition assembly 100-1 may further include a camera (or cameras) 170 and a sensor (or sensors) 180 that are used for alignment. The sensor 180 may be a confocal sensor. The camera 170 may confirm a first mark on the patterning slit sheet 130 and a second mark on the substrate 2 in real time to create data that is used to accurately align the patterning slit sheet 130 with the substrate in the XY plane, and the sensor 180 may create data regarding the interval between the patterning slit sheet 130 and the substrate 2 to maintain them at a proper interval.

By using the camera 170 and the sensor 180, it is possible to measure the interval between the substrate 2 and the patterning slit sheet 130 in real time and thus it is possible to align the substrate with the patterning slit sheet 130 in real time. Thus, the position precision of a pattern may be enhanced.

The closing member 140 may be arranged between the patterning slit sheet 130 and the deposition sources 110a and 110b in order to prevent a material from becoming deposited on a non-film forming region (e.g., non-deposition region) of the substrate 2. Although not shown in detail, the closing member 140 may include two neighboring plates. Because the non-film forming region of the substrate 2 is covered by the closing member 140, it is possible to effectively and easily prevent a material from becoming deposited on the non-film forming region of the substrate 2 without a separate structure.

Descriptions of a case have been given, in which a first support unit includes the guide unit 412, the side magnetic levitation bearing 414, and the upper magnetic levitation bearing 415, and a second support unit includes the top guide unit 413 and the top magnetic levitation bearing 416.

The first support unit supports both ends of the moving unit 430 or both ends of the carrier 431 in the first direction that the moving unit 430 to which the substrate 2 is fixed and which is a component of the first transfer unit 410 is transferred. The second support unit applies an attractive force through a magnetic field to a carrier 431 in a lower position without direct contact with the carrier 431 to support a side of the moving unit 430 opposite to a side close to the deposition assembly 100-1. However, the present invention is not limited thereto, and there may be other variations applied thereto.

Figure 6:
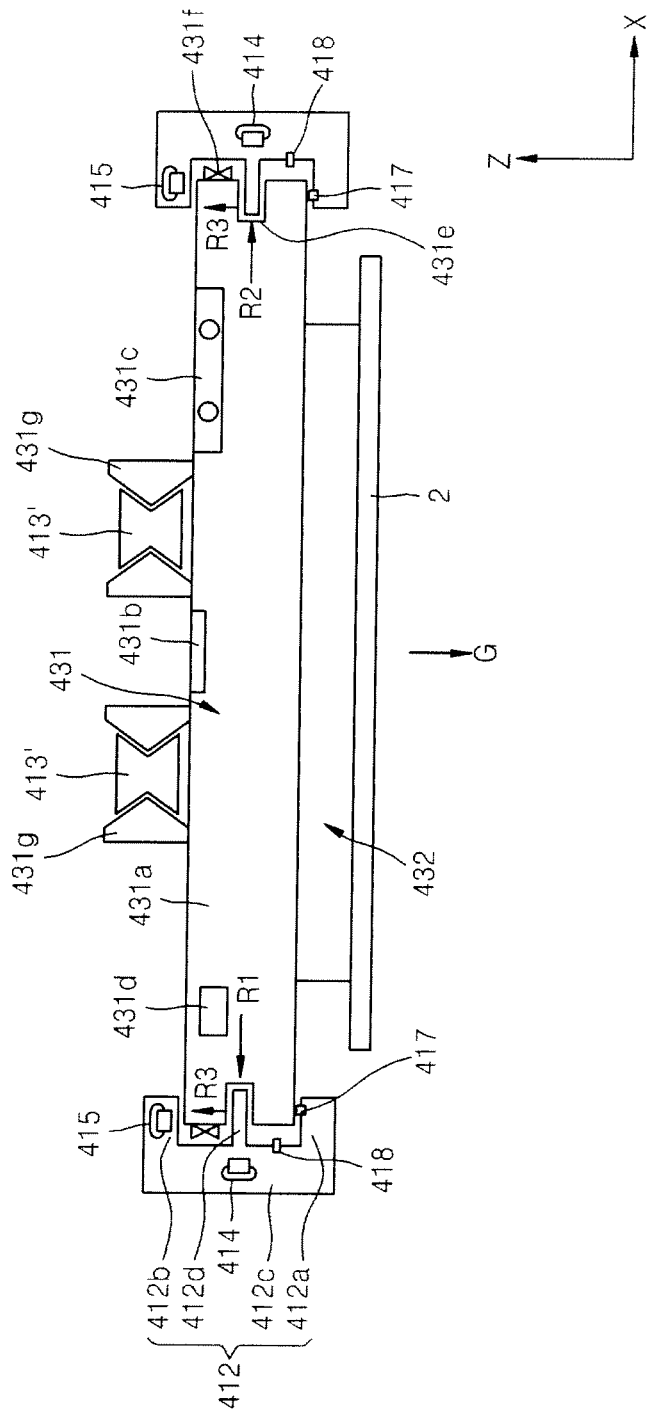
FIG. 6 is a schematic front view of a part of a deposition unit of a deposition apparatus according to another embodiment of the present invention.

For example, as shown in FIG. 6 that is a schematic front view of a part of the deposition unit of the deposition apparatus according to another embodiment of the present invention, the second support unit that supports a side of the moving unit 430 opposite to a side close to the deposition assembly 100-1 may include a guide rail 413'. The guide rail 413' may be arranged on the upper part of the inner space of the upper housing 104 through which the moving unit 430 may pass when the first transfer unit 410 transfers the moving unit 430, and may have a shape in which the moving unit 430 to which the substrate 2 is fixed is extended in the direction transferred by the first transfer unit 410 (in +Y direction). Such a guide rail 413' may engage with a guide block 431g that is arranged on a side of the moving unit 430 opposite to a side close to the deposition assembly 100-1, when the moving unit 430 is placed on a lower part (in the −Z direction).

In the case of the deposition apparatus according to the present embodiment, because it is possible to prevent the central part of the carrier 431 from sagging downwards (in −Z direction) due to gravity as the guide rail 413' engages with the guide block 431g of the carrier 431, deposition may be performed on a correct location and in an accurate pattern even if deposition is performed on a large-area substrate 2 so that a manufacturing yield may increase dramatically.

Although FIG. 6 shows that in a plane (ZX plane) perpendicular to the first direction (+Y direction) that the first transfer unit 410 transfers the moving unit 430, the first transfer unit 410 has two guide rails 413' in the upper housing 104 as components of the second support unit, the present invention is not limited thereto. That is, in the plane (ZX plane) perpendicular to the first direction (+Y direction) that the first transfer unit 410 transfers the moving unit 430, the first transfer unit may have one guide rail 413' or more than two guide rails 413', and there may be other variations applied thereto.

Figure 7:
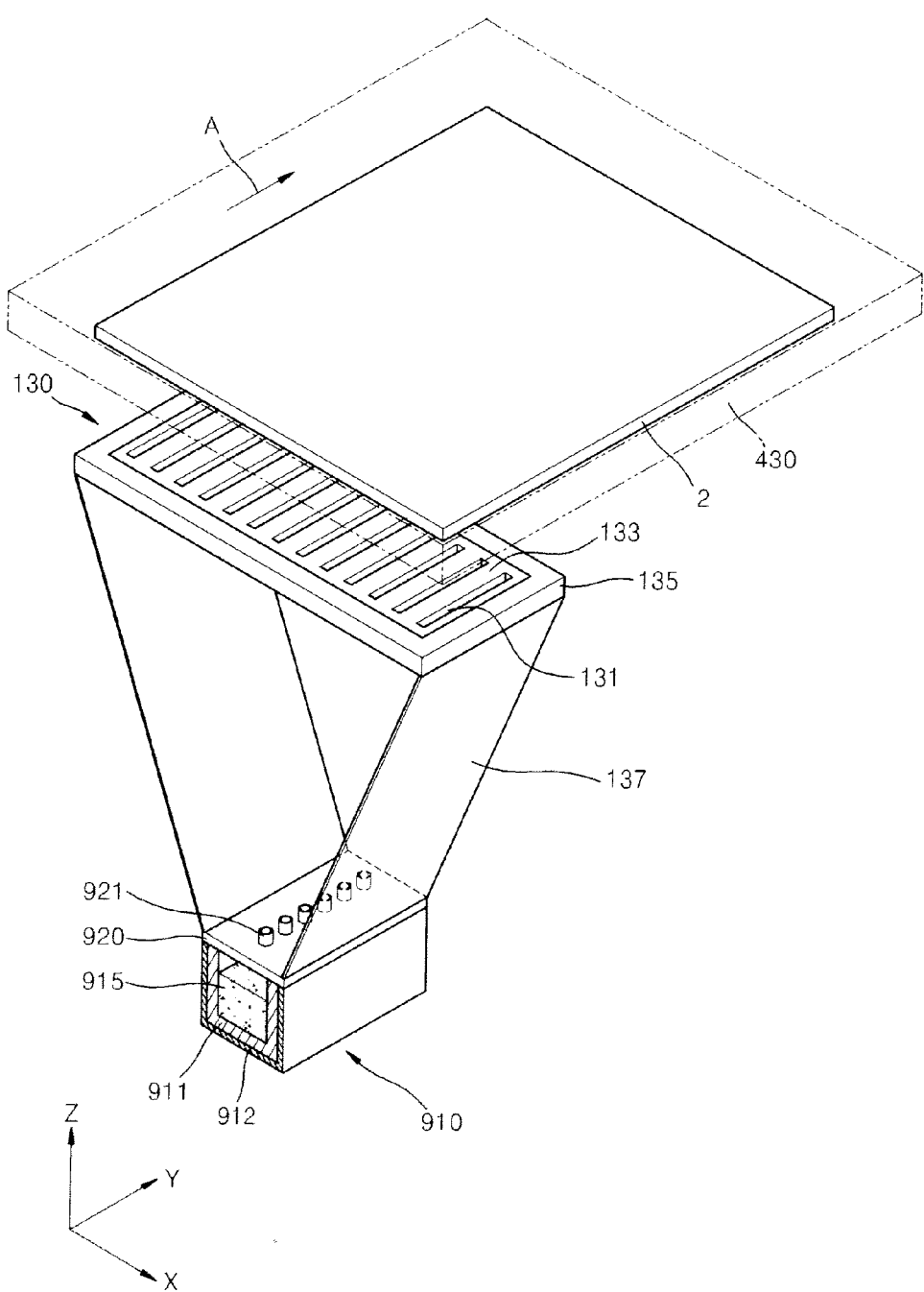
FIG. 7 is a schematic perspective view of a part of a deposition assembly of a deposition apparatus according to another embodiment of the present invention.

FIG. 7 is a schematic perspective view of a part of a deposition assembly of a deposition apparatus according to another embodiment of the present invention. For the deposition apparatus according to the above-described embodiment, the deposition source nozzle units 120a and 120b of the deposition assembly have a plurality of deposition source nozzles 121 that are arranged along the second direction (for example, X-axis direction) that intersects the first direction (+Y direction) and that is parallel to the substrate 2 fixed to the moving unit 430. However, in the case of the deposition apparatus according to the present embodiment, the plurality of deposition source nozzles 921 of a deposition source nozzle unit 920 are arranged along the first direction (+Y direction).

In manufacturing an organic light-emitting display apparatus, when forming an intermediate layer including an emission layer, a common layer may be needed to be integrally formed over the entire display region or a pattern layer may be needed to be formed only on a preset display region.

In the case of forming the common layer, the deposition source nozzle units 120a and 120b of the deposition assembly may have a plurality of deposition source nozzles 121 that are arranged along the second direction (for example, X-axis direction) that intersects the first direction (+Y direction) and is parallel to the substrate 2 fixed to the moving unit 430 as previously described to enhance the thickness uniformity of the formed common layer. In the case of forming the pattern layer, the deposition source nozzle unit 920 of the deposition assembly may have a plurality of deposition source nozzles 921 that are arranged along the first direction (+Y direction) as shown in FIG. 7 so that one deposition source nozzle 921 is placed in the second direction (for example, X-axis direction) that interacts the first direction (+Y direction) on the plane (ZX plane) perpendicular to the first direction (+Y direction) and that is parallel to the substrate 2 fixed to the moving unit 430. Thus, it is possible to decrease (e.g., significantly decrease) shadow when forming the pattern layer.

Although FIG. 7 shows only one deposition source and one deposition nozzle unit, a first deposition source and a second deposition source may be sequentially arranged along the first direction (+Y direction), a plurality of deposition nozzles of a first deposition nozzle unit of the first deposition source may be arranged along the first direction (+Y direction), and a plurality of deposition nozzles of the second deposition source nozzle unit may be also arranged along the first direction (+Y direction).

The above-described patterning slit sheet 130 may particularly have a shape as shown in FIG. 7. That is, the patterning slit sheet 130 may have a frame 135 such as a window frame and a sheet 133 that is coupled thereto by a welding technique, as shown in FIG. 7. A plurality of patterning slits 131 may be formed in the sheet 133, spaced apart along the X-axis direction, for example. A deposition material in a crucible 911 of the deposition source 910 may be evaporated by a heater 912, emitted through the deposition source nozzle 921 of the deposition source nozzle unit 920, and deposited on the substrate 2 via the patterning slit 131 of the patterning slit sheet 130. In this case, the deposition source 910 and/or the deposition source nozzle unit 920 and the patterning slit sheet 130 may be coupled by a connecting member 137.

Although the deposition apparatus has been described, the present invention is not limited thereto. For example, a method of manufacturing an organic light-emitting display apparatus using such a deposition apparatus also belongs to the scope of the present invention.

In the method of manufacturing an organic light-emitting display apparatus according to another embodiment of the present invention, after transferring the moving unit 430 into the chamber 101 by the first transfer unit 410 that is installed to pass through the chamber 101 while the substrate 2 is fixed to the moving unit 430, the substrate 2 may make a movement relative to the deposition assembly 100-1 in the first direction (+Y direction) by the first transfer unit 410 while the deposition assembly 100-1 and the substrate 2 that are arranged in the chamber 101 are spaced apart from each other, and a deposition material emitted from the deposition assembly 100-1 may be deposited on the substrate 2 to form a layer. Subsequently, after returning the moving unit 430, which is separated from the substrate 2, to the loading unit 200 by the second transfer unit 420 that is installed to pass through the chamber 101, the moving unit 430 may be cyclically transferred by the first transfer unit 410 and the second transfer unit 420.

In the method of manufacturing the organic light-emitting display apparatus, the deposition assembly may have components described regarding the deposition apparatus according to the above-described embodiments. That is, the layer may be formed by transferring a deposition material emitted from the deposition sources 110a and 110b of the deposition assembly 100-1 to the deposition source nozzle units 120a and 120b of the deposition assembly 100-1 near the first transfer unit 410 and then to the patterning slit sheet 130 of the deposition assembly 100-1 that is arranged to face the deposition source nozzle units 120a and 120b and includes a plurality of patterning slits 131 in one direction (X-axis direction), and depositing the deposition material on the substrate 2 fixed to the moving unit 430.

Furthermore, the layer may be formed while the first transfer unit 410 supports both ends of the moving unit 430 in the first direction (+Y direction) by using the first support unit and supports a side of the moving unit 430 opposite to a side close to the deposition assembly 100-1 by using the second support unit.

In particular, the layer may be formed while the second support unit that is placed at the upper inner space of the upper housing 104 through which the moving unit 430 may pass when the first transfer unit 410 transfers the moving unit 430, applies an attractive force to the moving unit 430 without direct contact with the moving unit 430 when the moving unit 430 is placed under the second support unit. In this case, the attractive force which the second support unit applies to the moving unit 430 may be due to a magnetic field and, to this end, the second support unit may have the top magnetic levitation bearing 416 including an electromagnet.

In the method of manufacturing the organic light-emitting display apparatus, even if a size of the moving unit 430 increases due to a size of the substrate 2 used in manufacturing the organic light-emitting display apparatus, the top magnetic levitation bearing 416 may prevent the central part of the moving unit 430 or the central part of the carrier 431 from sagging in a lower direction (−Z direction) due to gravity and thus deposition may be performed on a correct location and in an accurate pattern even if deposition is performed on a large-area substrate 2 so that a manufacturing yield may increase dramatically.

In forming the layer, a distance between the second support unit and the moving unit 430 may be measured by using the top gap sensor 419 and the intensity of the attractive force which the second support unit applies to the moving unit 430 may be regulated to keep the distance between the second support unit and the moving unit 430 constant.

According to a method of manufacturing an organic light-emitting display apparatus according to another embodiment of the present invention, forming a layer on the substrate 2 that is fixed to the moving unit 430 and that is transferred may include engaging the guide rail 413' with the guide block 431g of the moving unit 430, the guide rail 413' being placed on the upper inner space of the upper housing 104 through which the moving unit 430 being capable of passing when the first transfer unit 410 transfers the moving unit 430.

In the method of manufacturing the organic light-emitting display apparatus, even if a size of the moving unit 430 increases due to a size of the substrate 2 used in manufacturing the organic light-emitting display apparatus, it is possible to prevent the central part of the carrier 431 from sagging in a lower direction (−Z direction) due to gravity as the guide rail 413' engages with the guide block 431g of the carrier 431, and thus deposition may be performed on a correct location and in an accurate pattern even if deposition is performed on a large-area substrate 2 so that a manufacturing yield may increase dramatically.

Figure 8:
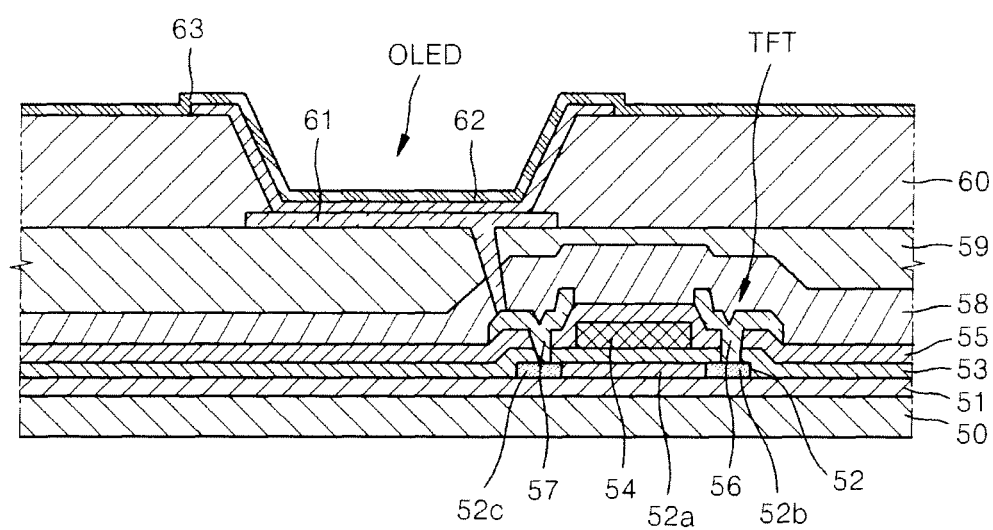
FIG. 8 is a schematic sectional view of an organic light-emitting display apparatus manufactured by using the deposition apparatus of FIG. 1.

FIG. 8 is a schematic sectional view of an organic light-emitting display apparatus manufactured by using the deposition apparatus of FIG. 1.

Referring to FIG. 8, various components of the organic light-emitting display apparatus are formed on a substrate 50. In this case, the substrate 50 may be the substrate 2 mentioned with reference to FIG. 3 or a part of the substrate 2. The substrate 50 may include a transparent material, such as a glass material, a plastic material, or a metal material.

A common layer such as a buffer layer 51, a gate dielectric layer 53, an inter-layer dielectric layer 55, etc. may be formed on the entire surface of the substrate 50, and a patterned semiconductor layer 52 including a channel region 52a, a source contact region 52b, and a drain contact region 52c may be formed on the substrate 50, and a gate electrode 54, a source electrode 56, and a drain electrode 57 that are components of a thin film transistor (TFT) may be formed along with such a patterned semiconductor layer.

In addition, a protective layer 58 covering such a TFT and a planar layer 59 which is placed on the protective layer 58 and the top of which is roughly planar may be formed on the entire surface of the substrate 50. Such a planar layer 59 may be formed to hold an organic light-emitting diode (OLED) that includes a patterned pixel electrode 61, a counter electrode 63 that is on the entire surface of the substrate 50, and a multilayer-structured intermediate layer 62 that is laid between the pixel electrode 61 and the counter electrode 63 and includes an emission layer. Of course, the intermediate layer 62 may be a common layer that is on the entire surface of the substrate 50, unlike FIG. 8, and other layers may be a patterned layer which is patterned to match the pixel electrode 61. The pixel electrode 61 may be electrically connected to the TFT through a via hole. A pixel defining layer 60 that covers the edge of the pixel electrode 61 and has an opening defining each pixel region may be formed on the planar layer 59 to roughly match the entire surface of the substrate 50.

In the case of such an organic light-emitting display apparatus, at least some of components may be formed by using the deposition apparatus according to the above-described embodiments.

The intermediate layer 62 may be formed by using the deposition apparatus according to the above-described embodiments. For example, a hole injection layer (HIL), a hole transport layer (HTL), an emission layer (EML), an electron transport layer (ETL), and an electron injection layer (EIL) that the intermediate layer 62 may include may be formed by using the deposition apparatus according to the above-described embodiments.

That is, when forming each layer of the intermediate layer 62, both ends of the moving unit 430 in the direction of transferring the moving unit 430 to which the substrate is fixed may be supported by the first support unit such as the upper magnetic levitation bearing 415 of the first transfer unit 410, and further, a side of the moving unit 430 opposite to a side close to the deposition assembly may be supported by the second support unit such as the top magnetic levitation bearing 416 or the guide rail 413'. Accordingly, even if the organic light-emitting display apparatus is manufactured by using a large-area substrate, it is possible to effectively prevent the central part of the large-area moving unit 430 from sagging due to its own weight as the guide rail 413' engages with the guide block 431g of the carrier 431, and thus it is possible to implement an organic light-emitting apparatus in which a deposition layer is formed on a correct location and in a desired pattern.

When a plurality of patterning slits 131 are arranged along the X-axis direction as shown in FIG. 7, one of the intermediate layers 62 may be formed with a linear pattern. Such a layer may be, for example, an emission layer.

Because the deposition apparatus of FIG. 1 enables deposition to be correctly performed on a preset region, as previously described, when depositing on a large-area substrate, it is possible to implement an organic light-emitting display apparatus of a high quality by correctly forming the intermediate layer 62 even if the organic light-emitting display apparatus has a 40 inch or larger substrate.

While the present invention has been particularly shown and described with reference to some example embodiments thereof, it will be understood by those of ordinary skill in the art that various changes in form and details may be made therein without departing from the spirit and scope of the present invention as defined by the following claims, and equivalents thereof.

What is claimed is:

1. A method of manufacturing an organic light-emitting display apparatus, the method comprising:
    transferring a moving unit into a chamber utilizing a first transfer unit configured to pass through the chamber, while a substrate is fixed to the moving unit wherein the first transfer unit includes a coil, the moving unit includes a magnetic rail along a central line of the moving unit, and the magnetic rail and the coil form a linear motor;
    depositing a deposition material radiated from a deposition assembly on the substrate and forming a layer while the first transfer unit transports the substrate relative to the deposition assembly in a first direction when the deposition assembly and the substrate are spaced apart from each other in the chamber;
    separating the moving unit from the substrate; and
    returning the moving unit separated from the substrate utilizing a second transfer unit configured to pass through the chamber,
    wherein the forming of the layer comprises supporting two opposing ends of the moving unit in a second direction perpendicular to the first direction by magnetic force from a first support unit having a magnetic levitation bearing, and supporting a side of the moving unit opposite to a side close to the deposition assembly by using a second support unit, the second support unit is laterally spaced apart from the magnetic rail along the central line of the moving unit and configured to balance a gravitational force in a central part of the moving unit,
    wherein the magnetic levitation bearing of the first support unit comprises two side magnetic levitation bearings and two upper or two lower magnetic levitation bearings,
    each of the two side magnetic levitation bearings faces a respective one of the two opposing ends of the moving unit, and the two side magnetic levitation bearings are configured to form an interval between the first support unit and the moving unit by balancing an attractive or repulsive force between one of the two side magnetic levitation bearings and the respective one of the two opposing ends of the moving unit with an attractive or repulsive force between the other one of the two side magnetic levitation bearings and the other one of the two opposing ends of the moving unit; and each of the two upper or the two lower magnetic levitation bearings is laterally spaced apart from the second support unit, and configured such that an attractive or repulsive force between the two upper or the two lower magnetic levitation bearings and the moving unit balances the gravitational force on the moving unit.

2. The method of claim 1, wherein the second support unit is placed at an upper inner space of a housing through which the moving unit is transferred when the first transfer unit transfers the moving unit, the moving unit is placed below the second support unit, and wherein the forming of the layer comprises applying an attractive force between the moving unit and the second support unit without direct contact between the moving unit and the second support unit.

3. The method of claim 2, wherein the forming of the layer comprises applying the attractive force by using a magnetic field generated by the second support unit.

4. The method of claim 3, wherein the forming of the layer comprises applying the attractive force by using the magnetic field to support the moving unit, the magnetic field being generated by an electromagnet disposed in the second support unit.

5. The method of claim 2, wherein the forming of the layer comprises measuring a distance between the second support unit and the moving unit by using a gap sensor.

6. The method of claim 5, wherein the forming of the layer comprises regulating an intensity of the attractive force which the second support unit applies to the moving unit to keep the distance between the second support unit and the moving unit constant, the distance being measured by using the gap sensor.

7. The method of claim 1, wherein the forming of the layer comprises aligning a guide rail with a guide block of the moving unit, the guide rail being placed at an upper inner space of the housing through which the moving unit is transferred when the first transfer unit transfers the moving unit.

8. The method of claim 1, wherein the forming of the layer comprises transferring the deposition material radiated from a deposition source of the deposition assembly to a deposition source nozzle unit of the deposition assembly near the first transfer unit and then to a patterning slit sheet of the deposition assembly that is arranged to face the deposition source nozzle unit and comprises a plurality of patterning slits in one direction, and depositing the deposition material on the substrate fixed to the moving unit.

* * * * *